United States Patent
Le Gallo et al.

(10) Patent No.: US 10,678,885 B2
(45) Date of Patent: *Jun. 9, 2020

(54) MEMORY DEVICE FOR MATRIX-VECTOR MULTIPLICATIONS

(71) Applicant: International Business Machines Corporation, Armonk, NY (US)

(72) Inventors: Manuel Le Gallo, Zurich (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/284,702

(22) Filed: Feb. 25, 2019

(65) Prior Publication Data

US 2019/0188242 A1 Jun. 20, 2019

Related U.S. Application Data

(63) Continuation of application No. 15/235,157, filed on Aug. 12, 2016, now Pat. No. 10,311,126.

(51) Int. Cl.
*G06F 17/16* (2006.01)
*G11C 13/04* (2006.01)
(Continued)

(52) U.S. Cl.
CPC ............ *G06F 17/16* (2013.01); *G11C 11/16* (2013.01); *G11C 11/56* (2013.01);
(Continued)

(58) Field of Classification Search
CPC ..... G06F 17/16; G11C 13/0002; G11C 13/04; G11C 13/047; G11C 13/0069
See application file for complete search history.

(56) References Cited

U.S. PATENT DOCUMENTS

| 4,588,255 A | 5/1986 | Tur et al. |
| 7,439,764 B2 | 10/2008 | Twigg et al. |

(Continued)

OTHER PUBLICATIONS

Truong et al., "New Memristor-Based Crossbar Array Architecture with 50-% Area Reduction and 48-% Power Saving for Matrix-Vector Multiplication of Analog Neuromorphic Computing", Journal of Semiconductor Technology and Science, vol. 14, No. 3, Apr. 2014, English Abstract only.

(Continued)

*Primary Examiner* — Matthew D Sandifer
(74) *Attorney, Agent, or Firm* — Scully, Scott, Murphy & Presser, P.C.; Daniel Morris, Esq.

(57) ABSTRACT

A device for performing a multiplication of a matrix with a vector. The device comprises a plurality of memory elements, a signal generator and a readout circuit. The signal generator is configured to apply programming signals to the memory elements. The signal generator is further configured to control a first signal parameter of the programming signals in dependence on matrix elements of the matrix and to control a second signal parameter of the programming signals in dependence on vector elements of the vector. The readout circuit is configured to read out memory values of the memory elements. The memory values represent result values of vector elements of a product vector of the multiplication. The memory elements may be in particular resistive memory elements or photonic memory elements. Additionally there is provided a related method and design structure for performing the multiplication of a matrix with a vector.

15 Claims, 7 Drawing Sheets

(51) Int. Cl.
  *G11C 13/00* (2006.01)
  *G11C 11/16* (2006.01)
  *G11C 11/56* (2006.01)
(52) U.S. Cl.
  CPC ...... *G11C 11/5607* (2013.01); *G11C 11/5614* (2013.01); *G11C 11/5678* (2013.01); *G11C 11/5685* (2013.01); *G11C 13/0002* (2013.01); *G11C 13/004* (2013.01); *G11C 13/0004* (2013.01); *G11C 13/0007* (2013.01); *G11C 13/0011* (2013.01); *G11C 13/0069* (2013.01); *G11C 13/04* (2013.01); *G11C 13/047* (2013.01)

(56) References Cited

U.S. PATENT DOCUMENTS

| | | |
|---|---|---|
| 7,536,431 B2 | 5/2009 | Goren et al. |
| 9,058,302 B2 | 6/2015 | Magerlein |
| 9,152,827 B2 | 10/2015 | Linderman et al. |
| 10,079,058 B1 | 9/2018 | Eleftheriou et al. |
| 2016/0336064 A1 | 11/2016 | Seo et al. |
| 2017/0178725 A1 | 6/2017 | Yang et al. |
| 2017/0228345 A1 | 8/2017 | Gupta et al. |
| 2018/0350433 A1 | 12/2018 | Hu et al. |

OTHER PUBLICATIONS

Sheridan et al., "Defect consideratons for robust sparse coding using memristor arrays", Proceedings of teh 2015 IEEE/ACM International Symposium on Nanoscale Architectures (NANOARCH), Jul. 8-10, 2015, Abstract only.

Li et al., "Spiking-based matrix computation by leveraging memristor crossbar array", 2015 IEEE Symposium on Computational Intelligence for Security and Defense Applications (CISDA), May 26-28, 2015, Abstract only.

List of IBM Patents or Patent Applications Treated As Related.

MEMORY DEVICE FOR MATRIX-VECTOR MULTIPLICATIONS

BACKGROUND

Cognitive computing is a promising technology for deriving intelligence and knowledge from huge volumes of data. Today's cognitive computers are usually based on the Von 0 architecture in which the computing and the memory units are separated. Cognitive computing is inherently data-centric, meaning that huge amounts of data need to be shuttled back and forth at high speeds. As the Von Neumann architecture is rather inefficient for such a task, it is becoming increasingly clear that other architectures are desired to build efficient cognitive computers, in particular architectures where memory and logic coexist in some form.

Memcomputing is a key non-Von Neumann approach being researched. A key element in this novel computing paradigm is a high-density, low-power, variable state, programmable and non-volatile memory device.

A fundamental computational primitive is a matrix-vector multiplication. This primitive is of particular interest as it forms the basis of several linear algebraic operations and it is one of the most commonly used mathematical operations in science and engineering. A matrix is usually represented by a two-dimensional array of matrix elements and a vector by a one-dimensional array of vector elements. A matrix may be considered as array of vectors. Hence a matrix-vector multiplication can be generalized to a matrix-matrix multiplication and to a vector-vector multiplication.

Accordingly there is a need for new and improved memcomputing devices, in particular for memcomputing devices that can perform matrix-vector multiplications.

SUMMARY

According to a first aspect, the invention is embodied as a device for performing a multiplication of a matrix with a vector. The device comprises a plurality of memory elements, a signal generator and a readout circuit. The signal generator is configured to apply programming signals to the memory elements. The signal generator is further configured to control a first signal parameter of the programming signals in dependence on matrix elements of the matrix and to control a second signal parameter of the programming signals in dependence on vector elements of the vector. The readout circuit is configured to read out memory values of the memory elements. The memory values represent result values of vector elements of a product vector of the multiplication.

According to another aspect a method for performing a multiplication of a matrix with a vector is provided. The method comprises applying, by a signal generator, programming signals to a plurality of memory elements. The method further comprises controlling a first signal parameter of the programming signals in dependence on matrix elements of the matrix and controlling a second signal parameter of the programming signals in dependence on vector elements of the vector. Furthermore, the method comprises reading out, by a readout circuit, memory values of the memory elements. The memory values represent result values of vector elements of a product vector of the multiplication.

According to another aspect a design structure is provided. The design structure is tangibly embodied in a machine readable medium for designing, manufacturing, or testing an integrated circuit. The design structure comprises a device for performing a multiplication of a matrix with a vector. The device comprises a plurality of memory elements and a a signal generator configured to apply programming signals to the memory elements. The signal generator is further configured to control a first signal parameter of the programming signals in dependence on matrix elements of the matrix and to control a second signal parameter of the programming signals in dependence on vector elements of the vector. The device further comprises a readout circuit configured to read out memory values of the memory elements. The memory values represent result values of vector elements of a product vector of the multiplication.

Embodiments of the invention will be described in more detail below, by way of illustrative and non-limiting examples, with reference to the accompanying drawings.

DETAILED DESCRIPTION

In reference to FIGS. 1-10, some general aspects and terms of embodiments of the invention are described.

According to embodiments of the invention memory elements may be non-volatile memory elements, in particular resistive memory elements or photonic memory elements.

According to embodiments of the invention, a resistive memory element may be defined as a memory element whose electrical resistance can be changed by applying an electrical signal to the resistive memory element. The electrical signal may be e.g. a current flowing through the resistive memory element, or an electrical voltage applied to the resistive memory element. The current and/or voltage may be e.g. applied to the resistive memory element in the form of pulses. As a result, the electrical resistance of a resistive memory element depends on the history of current that had previously flown through the memory element and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g. a chalcogenide. These resistive memory elements exhibit good performance in terms of power consumption, integration density potential, retention, and endurance.

Embodiments of the invention provide a way to do inexact fast matrix multiplication using a plurality of resistive memory elements by a simple and efficient architecture. The result from this multiplication may preferably be used in algorithms that do not require high precision for multiplication tasks. Such an algorithm that could be used for the post-processing of the results of the multiplication according to embodiments of the invention is e.g. the algorithm disclosed by Klavik et al. in "Changing Computing Paradigms Towards Power Efficiency", Proc. Royal Society A., 2014. The multiplication performed according to embodiments of the invention can be fast, low-power and may be scalable to matrix sizes of 10000×10000 and beyond.

According to embodiments of the invention the matrix-vector multiplication can be entirely realized by the resistive memory elements or the photonic memory elements. This may bring significant power and/or speed advantages compared to the conventional Von-Neumann approach where the data has to be shuttled back and forth between a central processing unit (CPU) and the memory.

As a matrix-vector multiplication can be generalized to a matrix-matrix multiplication and to a vector-vector multiplication, the device and the methods according to embodiments of the invention can also be used to perform matrix-matrix multiplications and vector-vector multiplications.

Figure 1:
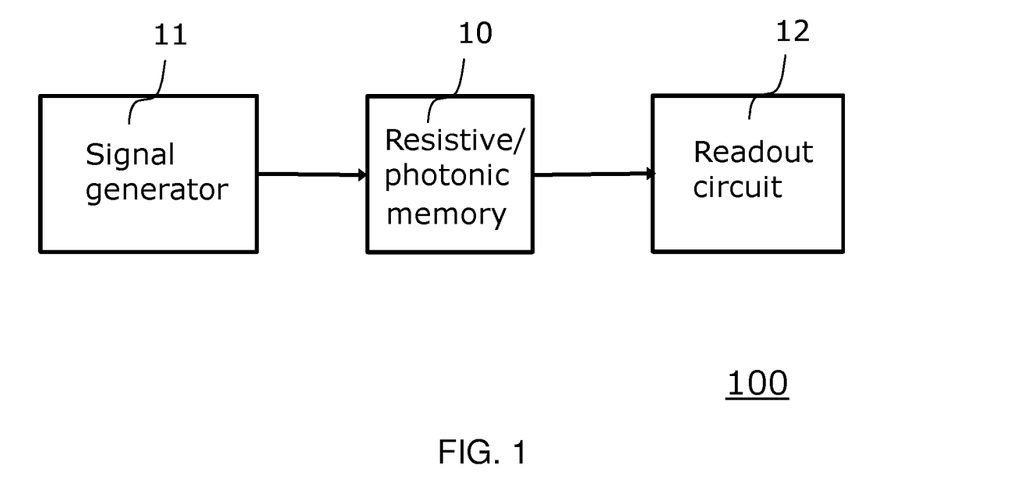
FIG. 1 illustrates a principal block diagram of a device for performing a multiplication of a matrix with a vector according to an embodiment of the invention.

FIG. 1 is a simplified schematic block diagram of a device 100 for performing a multiplication of a matrix with a vector. The device 100 comprises a memory 10 having a plurality of resistive or photonic memory elements. Furthermore, a signal generator 11 is provided. The signal generator 11 is configured to apply electrical or optical programming signals to the memory elements of the memory 10. The signal generator 11 comprises circuitry for programming the resistive or photonic memory cells during data write operation such that a multiplication of a matrix with a vector can be performed. During these write operations, the signal generator 11 can address individual memory cells by applying appropriate control signals to an array of word and bit lines in the memory 10. The signal generator 11 is configured to receive a matrix A and a vector x as input and to control a first signal parameter of the programming signals in dependence on matrix elements of the matrix A and to control a second signal parameter of the programming signals in dependence on vector elements of the vector x.

In addition, the device 100 comprises a readout circuit 12 configured to read out resistance values of the resistive memory elements or optical absorption values of the photonic memory elements. The readout circuit 12 comprises circuitry for making read measurements for detecting a state of the memory elements during data read operations. During these operations, the read out circuit can address individual memory elements by applying appropriate control signals to an array of word and bit lines in the memory 10. The resistance values or the optical absorption values represent result values of vector elements of a product vector of the multiplication.

The programming signal influences the resistance or absorption state of the respective memory element it is applied to. The first and the second signal parameters may generally be any parameter that is suitable to influence the programming characteristic of the memory elements. The values of the matrix elements are mapped to the first signal parameter of the programming signals. The mapping may be in particular a linear mapping. Accordingly, the higher the value of the respective matrix element, the higher/greater the first signal parameter. The values of the vector elements are mapped to the second signal parameter of the programming signals. The mapping may be in particular a linear mapping. Accordingly, the higher the value of the respective vector element, the higher/greater the second signal parameter.

The memory 10 may be generally any kind of resistive memory or photonic memory as described above. In particular it may be a phase change memory (PCM) or a resistive random access memory (RRAM). In the following it assumed that the resistive memory 10 is embodied as PCM. Accordingly the resistive memory 10 comprise a plurality of PCM cells as resistive memory elements. The PCM cells of memory 10 may comprise s=2 or s>2 programmable resistance states, the latter providing multilevel operation. The s programmable resistance-states correspond to different relative proportions of the amorphous and crystalline phases within the PCM material of the cell. These states may include a high-resistance, fully-amorphous RESET state, a low-resistance, fully-crystalline SET state, and a number of intermediate states corresponding to increasing size of the crystalline phase within the otherwise amorphous PCM material. The s programmable cell-states are typically defined in in terms of predetermined reference values, or ranges of values, of the resistance metric used for read detection by the readout circuit 12.

To perform a matrix-vector multiplication, the PCM cells are programmed according to embodiments in a kind of write operation. More particularly, the signal generator 11 applies a voltage to the cell via the word- and bit-lines such that the resulting programming signal sets the cell to a state that represents a result value of the multiplication. In a read operation, a (lower) read voltage is applied to the cell and the resulting cell current is measured to obtain the resistance metric. Readout circuit 12 can then detect the programmed cell state by comparing the read metric with the aforementioned reference values.

Figure 2:
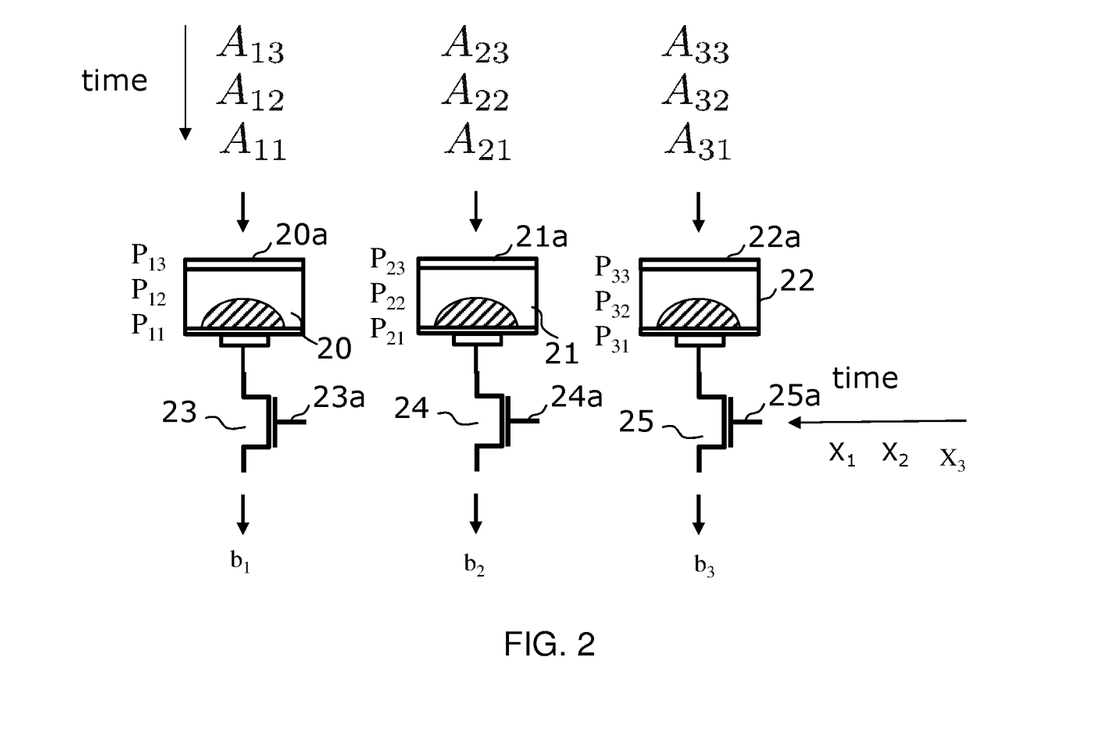
FIG. 2 illustrates an exemplary embodiment of a multiplication of a 3×3 matrix with a vector by means of a device according to an embodiment of the invention, wherein the memory elements are embodied as resistive memory elements.

Referring now to FIG. 2, an exemplary embodiment of a matrix multiplication is illustrated. More particularly, a matrix A of size 3×3 is multiplied with a vector x and the result is a product vector b:

$$\begin{bmatrix} A_{11} & A_{12} & A_{13} \\ A_{21} & A_{22} & A_{23} \\ A_{31} & A_{32} & A_{33} \end{bmatrix} \begin{bmatrix} x_1 \\ x_2 \\ x_3 \end{bmatrix} = \begin{bmatrix} b_1 \\ b_2 \\ b_3 \end{bmatrix}$$

Accordingly, the matrix A comprises a first column consisting of the matrix elements $A_{11}$, $A_{21}$ and $A_{31}$, a second column consisting of the matrix elements $A_{12}$, $A_{22}$ and $A_{32}$ and a third column consisting of the matrix elements $A_{13}$, $A_{23}$ and $A_{33}$ The vector x comprises the vector elements $x_1$, $x_2$ and $x_3$.

For such a multiplication of the matrix A with the size 3×3, the resistive memory 10 comprises an array of three resistive memory elements 20, 21 and 22. The three resistive memory elements 20, 21 and 22 comprise a corresponding array of input terminals 20a, 21a and 22a. The input terminals 20a, 21a and 22a are adapted to receive input signals from the signal generator 11 and to convey these input signals to the resistive memory elements 20, 21 and 22. The input terminals 20a, 21a and 22a may be e.g. implemented as metal contacts. The resistive memory elements 20, 21 and 22 are embodied as PCM cells. An array of transistors 23, 24 and 25 is arranged in series to the resistive memory elements 20, 21 and 22. The signal generator 11 is configured to control as control signal a voltage of control terminals 23a, 24a and 25a of the transistors 23, 24 and 25. The transistors may be in particular implemented as field effect transistors (FET). The control terminal may be in particular implemented as gate of the FET.

The resistive memory element 20 is allocated to provide the result value $b_1$ of the first vector element of the product vector b. The first vector element $b_1$ is the sum of three multiplications, namely $$b_1 = A_{11}x_1 + A_{12}x_2 + A_{13}x_3.$$

These three multiplications are performed in three consecutive steps by applying three consecutive programming signals $P_{11}$, $P_{12}$ and $P_{13}$ to the resistive memory element 20. The signal generator 11 controls the first signal parameter of the programming signals $P_{11}$, $P_{12}$ and $P_{13}$ in dependence on the matrix elements $A_{11}$, $A_{12}$ and $A_{13}$ and the second signal parameter in dependence on the vector elements $x_1$, $x_2$ and $x_3$. More particularly, in a first step the programming signal $P_{11}$ is applied to the resistive memory element 20, wherein the matrix element $A_{11}$ is mapped to the first signal parameter and the vector element $x_1$ is mapped to the second signal parameter. Hence the programming signal $P_{11}$ depends on the matrix element $A_{11}$ and the vector element $x_1$. In a second step the programming signal $P_{12}$ is applied to the resistive memory element 20, wherein the matrix element $A_{12}$ is mapped to the first signal parameter and the vector element $x_2$ is mapped to the second signal parameter. In a third step the programming signal $P_{13}$ is applied to the resistive memory element 20, wherein the matrix element $A_{13}$ is mapped to the first signal parameter and the vector element $x_3$ is mapped to the second signal parameter.

In a corresponding manner the resistive memory element 21 is allocated to provide the result value of the second vector element $b_2$ of the product vector b. The second vector element $b_2$ is the sum of three multiplications, namely $$b_2 = A_{21}x_1 + A_{22}x_2 + A_{23}x_3.$$

These three multiplications are also performed in three consecutive steps by applying three consecutive programming signals $P_{21}$, $P_{22}$ and $P_{23}$ to the resistive memory element 21. The signal generator 11 controls the first signal parameter of the programming signals $P_{21}$, $P_{22}$ and $P_{23}$ in dependence on the matrix elements $A_{21}$, $A_{22}$ and $A_{23}$ and the second signal parameter in dependence on the vector elements $x_1$, $x_2$ and $x_3$. More particularly, in a first step the programming signal $P_{21}$ is applied to the resistive memory element 21, wherein the matrix element $A_{21}$ is mapped to the first signal parameter and the vector element $x_1$ is mapped to the second signal parameter. In a second step the programming signal $P_{22}$ is applied to the resistive memory element 21, wherein the matrix element $A_{22}$ is mapped to the first signal parameter and the vector element $x_2$ is mapped to the second signal parameter.

In a third step the programming signal $P_{23}$ is applied to the resistive memory element 21, wherein the matrix element $A_{23}$ is mapped to the first signal parameter and the vector element $x_3$ is mapped to the second signal parameter.

In a corresponding manner the resistive memory element 22 is allocated to provide the result value of the third vector element $b_3$ of the product vector b. The third vector element $b_3$ is the sum of three multiplications, namely $$b_3 = A_{31}x_1 + A_{32}x_2 + A_{33}x_3.$$

These three multiplications are also performed in three consecutive steps by applying three consecutive programming signals $P_{31}$, $P_{32}$ and $P_{33}$ to the resistive memory element 22. The signal generator 11 controls the first signal parameter of the programming signals $P_{31}$, $P_{32}$ and $P_{33}$ in dependence on the matrix elements $A_{31}$, $A_{32}$ and $A_{33}$ and the second signal parameter in dependence on the vector elements $x_1$, $x_2$ and $x_3$. More particularly, in a first step the programming signal $P_{31}$ is applied to the resistive memory element 22, wherein the matrix element $A_{31}$ is mapped to the first signal parameter and the vector element $x_1$ is mapped to the second signal parameter. In a second step the programming signal $P_{32}$ is applied to the resistive memory element 22, wherein the matrix element $A_{32}$ is mapped to the first signal parameter and the vector element $x_2$ is mapped to the second signal parameter. In a third step the programming signal $P_{33}$ is applied to the resistive memory element 22, wherein the matrix element $A_{33}$ is mapped to the first signal parameter and the vector element $x_3$ is mapped to the second signal parameter.

According to embodiments of the invention the above described first step of the required multiplication for the first vector element $b_1$ can be performed simultaneously with the first steps of the required multiplication for the second vector element $b_2$ and the third vector element $b_3$. And in a corresponding manner the above described second step of the required multiplication for the first vector element $b_1$ can be performed simultaneously with the second steps of the required multiplication for the second vector element $b_2$ and the third vector element $b_3$. And in a corresponding manner the above described third step of the required multiplication for the first vector element $b_1$ can be performed simultaneously with the third steps of the required multiplication for the second vector element $b_2$ and the third vector element $b_3$.

Hence embodiments of the invention utilize the accumulative property of the resistive memory elements 20, 21 and 22 to perform the summation of the three consecutive multiplication operations required to compute the respective vector element of the product vector b. In other words, the resistive memory 10 provides a resistive memory element for each vector element of the product vector and it performs the multiplication by a plurality of successive steps in an accumulative manner. At each of the successive steps the resistive memory 10 performs simultaneously a multiplication of column elements of one of the columns of the matrix with a corresponding vector element of the vector. As an example, it performs simultaneously a multiplication of the column elements $A_{11}$, $A_{21}$ and $A_{31}$ of the first column with the corresponding vector elements $x_1$.

As illustrated above, only 3 resistive memory elements are needed to perform a multiplication of a 3×3 matrix. Or more generally, only N resistive memory elements are needed to perform a multiplication of a N×N matrix.

Figure 3:
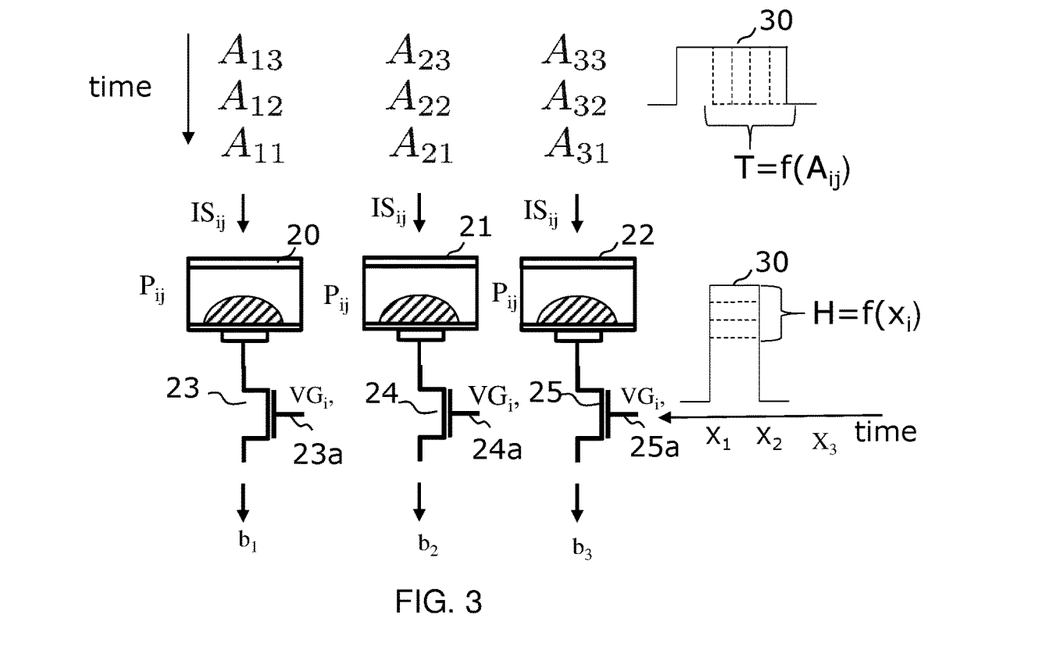
FIG. 3 illustrates an exemplary embodiment of signal parameters of programming signals applied to a resistive memory of a device according to an embodiment of the invention.

FIG. 3 illustrates an exemplary embodiment of signal parameters of programming signals $P_{ij}$ applied to the resistive memory as described with reference to FIG. 2.

According to this embodiment the signal generator 11 is embodied as a pulse generator configured to apply electrical pulses 30 to the resistive memory elements 20, 21 and 22 of the resistive memory 10. Furthermore, the first signal parameter of the programming signals $P_{ij}$ is a first pulse parameter and the first pulse parameter is a duration T of the pulses 30. More particularly, the respective value of the matrix elements $A_{ij}$ of the matrix A is mapped to the duration T of the pulse 30 that is applied to the resistive memory elements 20, 21 or 22. In other words, the duration T is configured to be a function f of the matrix elements $A_{ij}$. Furthermore, the second signal parameter is a pulse parameter and the second pulse parameter is an amplitude of the pulses 30. More particularly, the respective value of the vector elements $x_i$ of the vector x is mapped to the amplitude H of the pulse 30 that is applied to the resistive memory elements 20, 21 or 22. In other words, the amplitude H is configured to be a function f of the vector elements $x_i$.

The signal generator 11 is configured to provide input signals $IS_{ij}$ to the resistive memory elements 20, 21 and 22. The length of the pulses 30 of the programming signals $P_{ij}$ can be controlled by the length of the input signals $IS_{ij}$. The amplitude H of the programming pulses $P_{ij}$ can be controlled by applying control voltages $VG_i$ to the control terminals 23a, 24a and 25a of the transistors 23, 24 and 25. The control terminals 23a, 24a and 25a are preferably interconnected with each other and hence receive the same control voltage $VG_i$. This enables to perform the multiplication operations of the column elements of the matrix A simultaneously. The higher the control voltage $VG_i$, the higher the pulse amplitude of the programming signals $P_{ij}$. Hence according to embodiments the resulting programming signals $P_{ij}$ that are applied to the memory elements 20, 21 and 22 depend on the one hand on the input signals $IS_{ij}$ applied to the input terminals of the memory elements 20, 21 and 22 and on the other they depend on the common control signal $VG_i$ applied to the control terminals 23a, 24a and 25a.

The pulses 30 may have e.g. durations T between 10 ns and 100 ns. The amplitude H of the pulses 30 may be e.g. in a range between 1V and 3V. The result values $b_i$ may be obtained by reading out the state of each individual resistive memory element 20, 21 and 22, e.g. by measuring the conductance.

Figure 4:
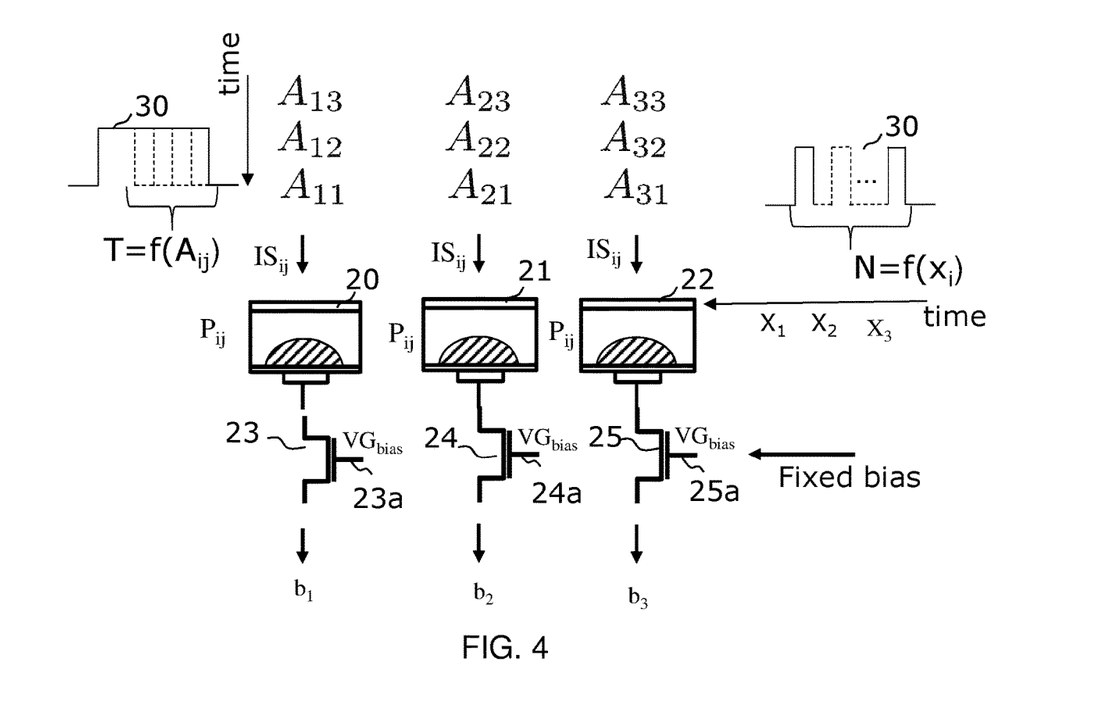
FIG. 4 illustrates another exemplary embodiment of signal parameters of the programming signals applied to the resistive memory.

FIG. 4 illustrates another exemplary embodiment of signal parameters of the programming signals applied to the resistive memory as described with reference to FIG. 2.

According to this embodiment the signal generator 11 is also embodied as a pulse generator configured to apply electrical pulses 30 to the resistive memory elements 20, 21 and 22 of the resistive memory 10. Furthermore, the first pulse parameter of the programming signals $P_{ij}$ is also a duration T of the pulses 30. The second signal parameter is a number N of the pulses applied to the respective resistive memory element. More particularly, the respective value of the vector elements $x_i$ of the vector x is mapped to the number N of pulses that are applied to the resistive memory elements 20, 21 or 22. In other words, the number N is a function f of the vector elements $x_i$. The higher the value of the respective vector element $x_i$, the more pulses are applied. Hence each pulse with a duration T according to the first signal parameter is applied a number N of times. As an example, the number N may range between 0 and 10.

In more detail, the signal generator 11 is configured to provide input signals $IS_{ij}$ to the resistive memory elements 20, 21 and 22. The length of the pulses 30 of the programming signals $P_{ij}$ can be controlled by the length of the pulses of the input signals $IS_{ij}$. The number of the pulses 30 of the programming signals $P_{ij}$ can be controlled by the number of the pulses of the input signals $IS_{ij}$. Hence according to this embodiment the first and the second signal/pulse parameter of the programming signals is controlled by the input signals $IS_{ij}$ applied to the input terminals of the resistive memory elements 20, 21 and 22. The control terminals 23a, 24a and 25a are according to this embodiment also interconnected with each other and are configured to receive the same fixed voltage $VG_{bias}$. Hence according to this embodiment the first and the second signal parameters of the programming signals $P_{ij}$ that are applied to the memory elements 20, 21 and 22 are controlled by two different parameters of the input signals $IS_{ij}$ applied to the input terminals of the memory elements 20, 21 and 22.

Again, the result values $b_i$ may be obtained by reading out the state of each individual resistive memory element 20, 21 and 22, e.g. by measuring the conductance.

Figure 5:
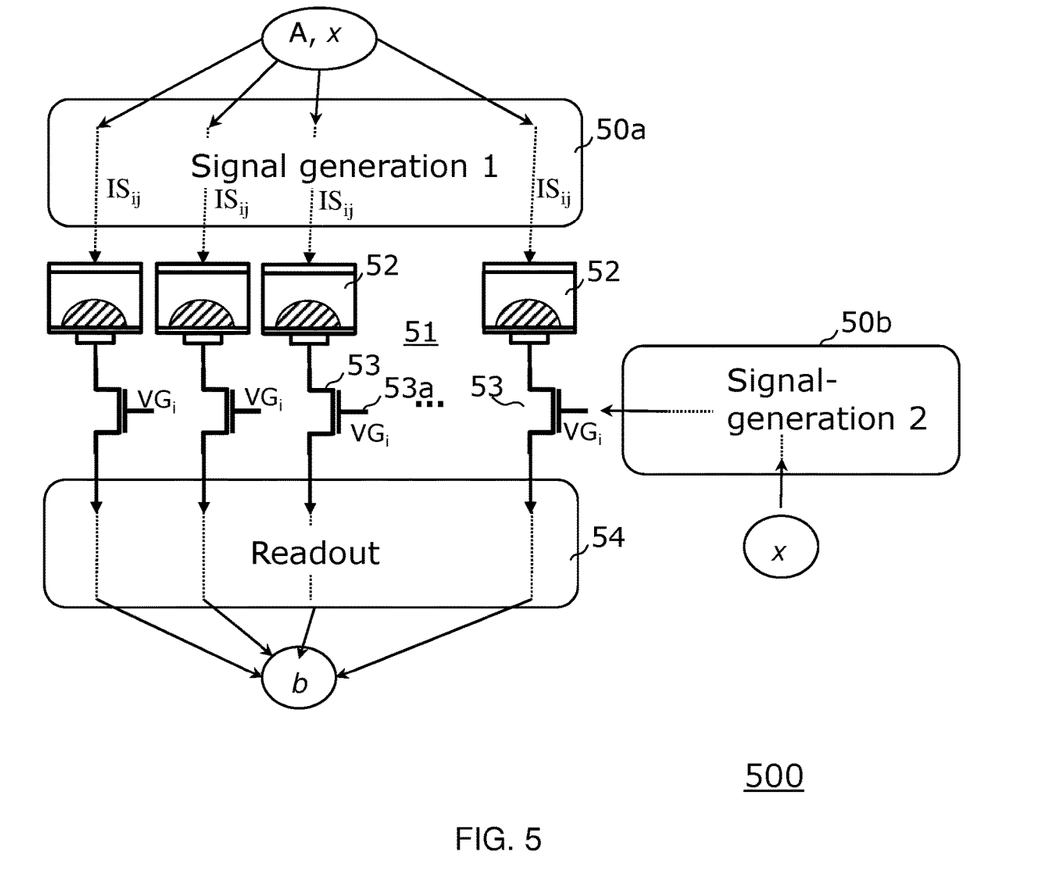
FIG. 5 shows an exemplary schematic block diagram of a device for performing a multiplication of a matrix with a vector.

FIG. 5 shows an exemplary schematic block diagram of a device 500 for performing a multiplication of a matrix A with a vector x. In this embodiment the signal generator 11 of FIG. 1 comprises a first signal generation unit 50a and a second signal generation unit 50b.

The first signal generation unit 50a receives the matrix A and the vector x as input and applies electrical input signals $IS_{ij}$ to a resistive memory 51. The resistive memory 51 comprises according to this embodiment an array of resistive memory elements 52 and a corresponding array of transistors 53 coupled in series to the resistive memory elements 52. The second signal generation unit 50b receives the vector x and provides control signals $VG_i$ to control terminals 53a of the transistors 53. A readout circuit 54 is configured to read out resistance values from the resistive memory elements 52 that represent result values of vector elements $b_i$ of a resulting product vector b of the multiplication.

Figure 6:
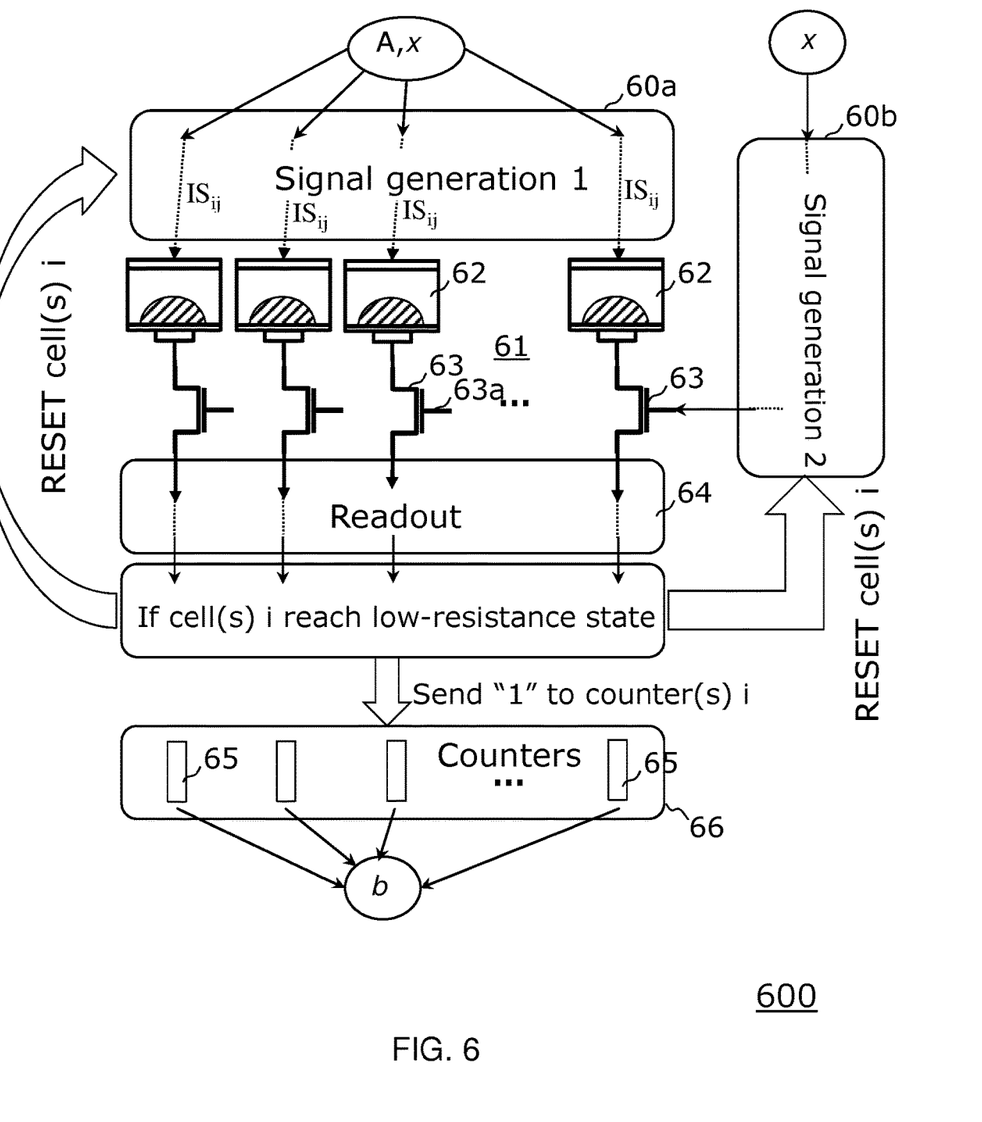
FIG. 6 shows an exemplary schematic functional diagram of a device for performing a multiplication of a matrix with a vector.

FIG. 6 shows an exemplary schematic functional diagram of a device 600 for performing a multiplication of a matrix A with a vector x. The device 600 comprises a first signal generation unit 60a and a second signal generation unit 60b. The first signal generation unit 60a receives the matrix A and the vector x as input and applies electrical input signals $IS_{ij}$ to a resistive memory 61. The resistive memory 61 comprises according to this embodiment an array of resistive memory elements 62 and a corresponding array of transistors 63 coupled in series to the resistive memory elements 62. The second signal generation unit 60b receives the vector x and provides control signals $VG_i$ to control terminals 63a of the transistors 63. The resistive memory elements 62 are embodied as phase change memory elements. A readout circuit 64 is configured to read out resistance values from the resistive memory elements 62. The resistive memory elements 62, embodied as PCM cells, are operated in the left part of the resistance-current programming curve of the PCM cells. Accordingly, initially a Reset-pulse is applied to the PCM cells 62 in order to bring the PCM-cells 62 in the amorphous state. Then during the multiplication computation, current and/or voltage pulses are applied to the PCM cells as programming signals that heat the PCM cells 62 above the crystallization temperature and result in a partial crystallization of the PCM cells 62. Accordingly, the resistance of the resistive memory elements 62 is lowered by the application of the current and/or voltage pulses. The readout circuit 64 comprises circuitry to detect a predefined low resistance state of the resistive memory elements 62. If the readout circuit 64 detects the predefined low resistance state, it send an intermediate result value of the pending multiplication to a corresponding counter 65 of a counter array 66. The counter array 66 comprises one counter 65 for each resistive memory element 62. The intermediate result value could be e.g. just a binary "1"-signal that shall indicate to the respective counter 65 that it shall increase its counter value by 1. In addition, the readout circuit 64 sends control signals to the signal generation unit 60a and the signal generation unit 60b to indicate that a reset of the respective resistive memory element 62/PCM cell 62 shall be performed. Then the signal generation unit 60a and the signal generation unit 60b apply a reset pulse to the respective resistive memory element 62 having the low resistance state. This brings the respective memory element 62 back to the amorphous state and the multiplication computation can be continued. If the multiplication computation has been completed, the device 600 reads out the counter values of the counter 65 of the counter array 66. The counter values of the counters 65 represent the result values of the vector elements $b_i$ of the product vector b. The counter array 66 may be e.g. implemented in CMOS technology or it may be implemented by additional PCM cells.

Figure 7:
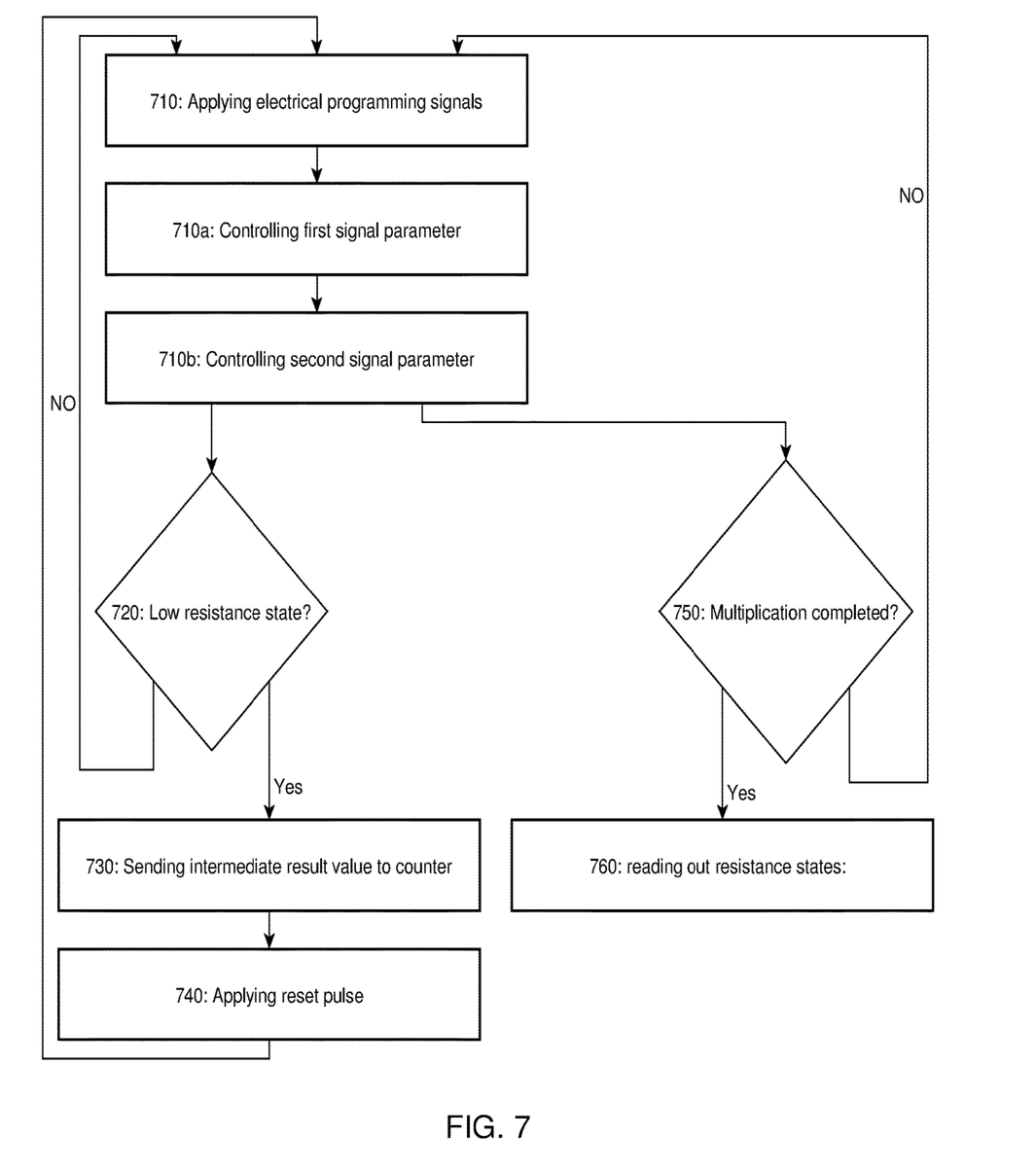
FIG. 7 shows a flowchart of method steps of a method for performing a multiplication of a matrix with a vector.

FIG. 7 shows a flowchart of method steps of a method for performing a matrix multiplication of a matrix with a vector. The method can be e.g. performed by the device 100 of FIG. 1. In the following the method is described for a memory comprising resistive memory elements.

At a step 710, the signal generator 11 applies electrical programming signals to a plurality of resistive memory elements.

At a step 710a, the signal generator controls a first signal parameter of the programming signals in dependence on matrix elements of the matrix.

At a step 710b, the signal generator controls a second signal parameter of the programming signals in dependence on vector elements of the vector.

The steps 710, 710a and 710b are preferably performed simultaneously.

At a step 720, the device checks whether one of the resistive memory cells has reached a low resistance state.

If a low resistance state has been detected, the device sends in a step 730 an intermediate result value of a pending multiplication to a counter allocated to the respective resistive memory element having the low resistance state.

Then it applies in a step 740 a reset pulse to the respective resistive memory element having the low resistance state.

Then the device continues with steps 710, 710a and 710b.

If the device detects at a step 750 that the multiplication has been completed, the readout circuit reads out at a step 760 the resistance values and the counter values, respectively. The resistance values represent result values of vector elements of a product vector of the multiplication.

Figure 8:
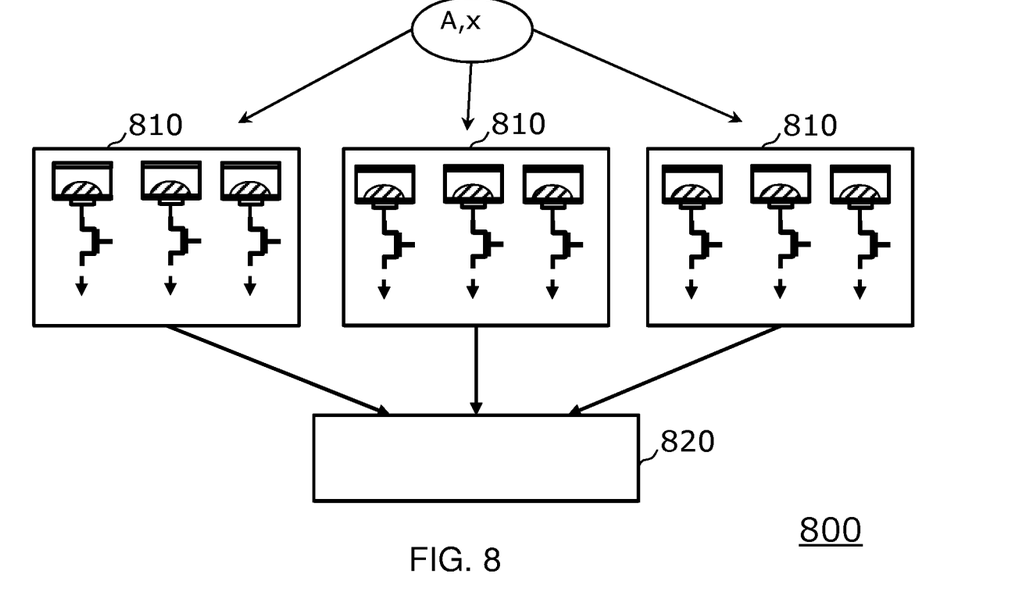
FIG. 8 shows a schematic block diagram of another device for performing a multiplication of a matrix with a vector.

FIG. 8 shows a schematic block diagram of another device 800 for performing a multiplication of a matrix A with a vector x. The device 800 is configured to perform multiple runs for a respective multiplication. For this it comprises three identical arrays 810 of resistive memory elements. The three arrays 810 are all configured to perform in parallel a multiplication of a matrix A with a vector x, thereby performing three parallel runs for the multiplication. A readout circuit 820 is configured to receive the result values of all three multiplications from the three arrays 810. The readout circuit 820 is then configured to perform an averaging of the result values of the three arrays 810. Such an averaging may increase the accuracy of the results of the multiplication. The number of multiple runs can be adapted according to the needs of the respective application. According to other embodiments, the multiple runs could also be performed in a serial manner one after the other.

Figure 9:
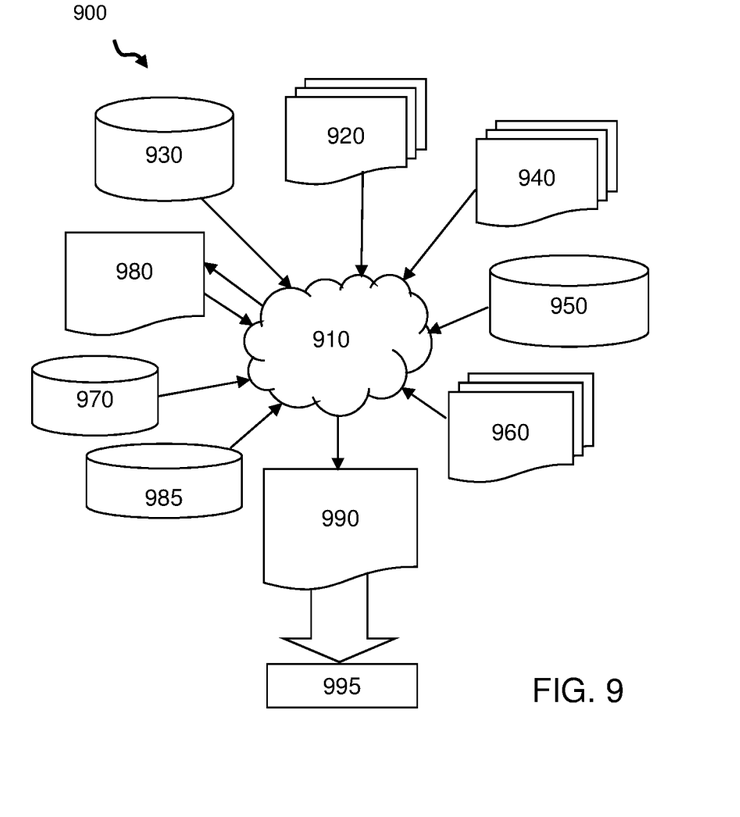
FIG. 9 shows a block diagram of an exemplary design flow.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown e.g. in FIGS. 1-6, 8 and 10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6, 8 and 10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 and 8 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6, 8 and 10. In one embodiment, design structure 990 may comprise a compiled, executable HDL simulation model that functionally simulates the devices shown in FIGS. 1-6, 8 and 10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6, 8 and 10. Design structure 990 may then proceed to a stage 995 where, for example, design structure 990: proceeds to tape-out, is released to manufacturing, is released to a mask house, is sent to another design house, is sent back to the customer, etc.

Figure 10:
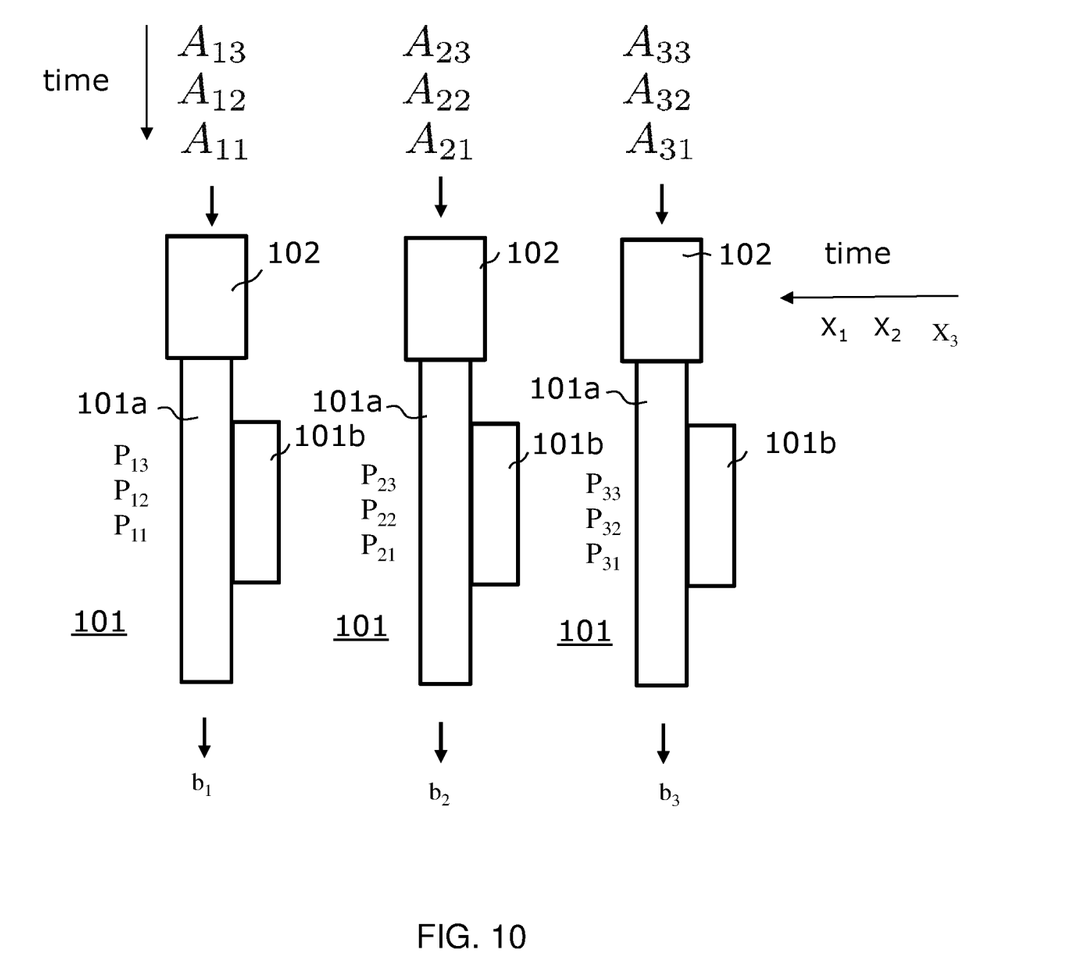
FIG. 10 shows a schematic diagram of another device for performing a multiplication of a matrix with a vector, wherein the memory elements are embodied as photonic memory elements.

FIG. 10 shows a device comprising photonic memory elements 101 as memory elements. The photonic memory elements 101 establish optical equivalents to the electrical resistive memory elements 20, 21 and 22 as described with reference to FIG. 2. The programming signals are embodied as optical programming signals, in particular as optical pulses, and the memory values are optical absorption values. The photonic memory elements 101 comprise respectively an optical waveguide 101a. Furthermore, the photonic memory elements 101 comprise respectively an absorption layer 101b. The absorption layers 101b are coupled to the optical waveguides 101a and absorb a fraction of the optical pulses transmitted in the waveguides 101a. The absorption of the absorption material can be tuned by write pulses applied to the optical waveguides 101a. More particularly, during the application of write pulses the tunable absorption material will change its optical properties. The absorption material may be in particular a phase change material. During the application of optical read pulses, the absorption layers 101b absorb a part of the optical read pules and emit the rest. The optical absorption values of the absorption layers 101b may be in particular a degree of absorption and can be used as memory value of the respective photonic memory element 101. The optical absorption values represent result values of the vector elements $b_1$, $b_2$ and $b_3$ of the respective multiplication.

An array of optical switches 102 or optical transistors 102 is arranged in series in front of the photonic memory elements 101. According to this embodiment the signal generator 11 of FIG. 1 would be implemented as optical signal generator for providing optical signals to the waveguides 101a. The optical signal generator 11 would then be further configured to control a control signal of control terminals of the optical transistors/switches 102.

Otherwise the photonic memory elements 101 of FIG. 10 can be operated in an equivalent way as the resistive memory elements described above to perform a multiplication of a matrix with a vector.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

What is claimed is:

1. A device for performing a multiplication of a matrix with a vector, the device comprising:
    a plurality of memory elements;
    a signal generator configured to
        apply programming signals to the memory elements;
        control a first signal parameter of the programming signals in dependence on matrix elements of the matrix; and
        control a second signal parameter of the programming signals in dependence on vector elements of the vector; and
    a readout circuit configured to read out memory values of the memory elements, the memory values representing result values of vector elements of a product vector of the multiplication, wherein the plurality of memory elements is configured as an array of memory elements, a memory element provided for each vector element of the product vector, wherein
    to perform the multiplication the signal generator and the plurality of memory elements are configured to:
    perform the multiplication by a plurality of successive steps in an accumulative manner; and
    perform at each of the successive steps simultaneously a multiplication of column elements of one of the columns of the matrix with a corresponding vector element of the vector.

2. The device according to claim 1, wherein the signal generator is a pulse generator configured to apply pulses to the memory elements and wherein the first signal parameter is a first pulse parameter and the second signal parameter is a second pulse parameter.

3. The device according to claim 2, wherein the first pulse parameter is a duration of the pulses.

4. The device according to claim 2, wherein the second pulse parameter is an amplitude of the pulses.

5. The device according to claim 2, wherein the second pulse parameter is a number of the pulses.

6. The device as claimed in claim 1, wherein the device comprises
    an array of input terminals configured to convey an input signal to the memory elements; and
    an array of transistors arranged in series to the memory elements;
    wherein the signal generator is configured to control a control signal of a control terminal of the transistors.

7. The device as claimed in claim 1, wherein
    the memory elements are resistive memory elements;
    the programming signals are electrical programming signals; and
    the memory values are resistance values.

8. The device as claimed in claim 7, wherein the resistive memory elements are one of Phase change memory (PCM) elements, Conductive bridge resistive memory elements, Metal-oxide resistive random access memory (RRAM) elements and Magneto-resistive random access memory (MRAM) elements.

9. The device as claimed in claim 7, wherein the resistive memory elements are Phase change memory elements and wherein the device is configured to:
    apply a Reset-pulse to the PCM elements in order to bring the PCM-elements in the amorphous state;
    apply current pulses to the PCM elements that heat the PCM elements above the crystallization temperature, thereby lowering the resistance of the PCM elements.

10. The device according to claim 7, wherein
    the resistive memory elements are phase change memory elements;
    the device comprises an array of counters; and
    the device is configured to:
        detect a predefined low resistance state of the resistive memory elements; send an intermediate result value of a pending multiplication to a counter allocated to the respective resistive memory element having the low resistance state; and
        apply a reset pulse to the respective resistive memory element having the low resistance state.

11. The device according to claim 10, wherein the result values of the vector elements of the product vector are represented by counter values of the counter.

12. The device as claimed in claim 1, wherein
    the memory elements are photonic memory elements;
    the programming signals are optical programming signals; and
    the memory values are optical absorption values.

13. A method for performing a matrix multiplication of a matrix with a vector, the method comprising:
    applying, by a signal generator, programming signals to a plurality of memory elements;
    controlling a first signal parameter of the programming signals in dependence on matrix elements of the matrix;
    controlling a second signal parameter of the programming signals in dependence on vector elements of the vector; and
    reading out, by a readout circuit, memory values of the memory elements, the memory values representing result values of vector elements of a product vector of the multiplication, wherein the plurality of memory elements is configured as an array of memory elements, a memory element provided for each vector element of the product vector, wherein
    to perform the matrix multiplication the signal generator and the plurality of memory elements are configured to:
    perform the multiplication by a plurality of successive steps in an accumulative manner; and
    perform at each of the successive steps simultaneously a multiplication of column elements of one of the columns of the matrix with a corresponding vector element of the vector.

14. The method according to claim 13, wherein the memory elements are resistive memory elements and the resistive memory elements are phase change memory elements and wherein the method further comprises:
    detecting a predefined low resistance state of the resistive memory elements; sending an intermediate result value of a pending multiplication to a counter allocated to the respective resistive memory element having the low resistance state; and
    applying a reset pulse to the respective resistive memory element having the low resistance state.

15. A design structure tangibly embodied in a non-transitory machine readable medium for designing, manufacturing, or testing an integrated circuit, the design structure comprising:
    a device for performing a multiplication of a matrix with a vector comprising a plurality of memory elements;
a signal generator configured to
- apply programming signals to the memory elements;
- control a first signal parameter of the programming signals in dependence on matrix elements of the matrix;
- control a second signal parameter of the programming signals in dependence on vector elements of the vector; and a readout circuit configured to read out memory values of the memory elements, the memory values representing result values of vector elements of a product vector of the multiplication, wherein the plurality of memory elements is configured as an array of memory elements, a memory element provided for each vector element of the product vector, wherein to perform the matrix multiplication the signal generator and the plurality of memory elements are configured to:

perform the multiplication by a plurality of successive steps in an accumulative manner; and perform at each of the successive steps simultaneously a multiplication of column elements of one of the columns of the matrix with a corresponding vector element of the vector.

* * * * *